(12) United States Patent
Eum et al.

(10) Patent No.: US 7,773,665 B2
(45) Date of Patent: Aug. 10, 2010

(54) APPARATUS AND METHOD FOR CORRESPONDING FREQUENCY SYNCHRONIZATION IN ON-CHANNEL REPEATER

(75) Inventors: Ho-Min Eum, Daejeon (KR); Yong-Tae Lee, Daejeon (KR); Seung-Won Kim, Daejeon (KR); Heung-Mook Kim, Daejeon (KR); Jae-Hyun Seo, Daejeon (KR); Sung-Ik Park, Daejeon (KR); Soo-In Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 919 days.

(21) Appl. No.: 11/579,657

(22) PCT Filed: May 12, 2005

(86) PCT No.: PCT/KR2005/001394

§ 371 (c)(1),
(2), (4) Date: Nov. 6, 2006

(87) PCT Pub. No.: WO2005/117433

PCT Pub. Date: Dec. 8, 2005

(65) Prior Publication Data

US 2009/0129450 A1 May 21, 2009

(30) Foreign Application Priority Data

May 12, 2004 (KR) ............. 10-2004-0033656

(51) Int. Cl.
*H04L 25/60* (2006.01)
*H03D 3/24* (2006.01)
(52) U.S. Cl. .................................. 375/215; 375/376
(58) Field of Classification Search .............. 375/215, 375/214, 329; 455/13.1, 70, 71, 63
See application file for complete search history.

(56) References Cited

U.S. PATENT DOCUMENTS 5,694,419 A * 12/1997 Lawrence et al. ........... 375/222

(Continued)

FOREIGN PATENT DOCUMENTS

EP 1 109 332 A2 12/2000

(Continued)

OTHER PUBLICATIONS

Bretl, et al., Single Carrier VSB Digital Television Transmission, Single-Frequency Networks, and Repeater Systems, Feb. 1996, *IEEE Transactions on Consumer Electronics*, vol. 42, No. 1.
Salehian, et al., On-Channel Repeater for Digital Television Broadcasting Service, Jun. 2002, *IEEE Transactions on Broadcasting*, vol. 48, pp. 97-102.

*Primary Examiner*—Khai Tran
(74) *Attorney, Agent, or Firm*—Ladas & Parry LLP

(57) ABSTRACT

Provided is a frequency synchronizing apparatus and method that can synchronize frequencies between receiving signals and transmitting signals by extracting a carrier error and sampling timing error information in a synchronization process of the receiving signal from a main transmitter or another repeater and reflecting them in the transmitting signal in an on-channel repeater. The apparatus includes a carrier recovery means for compensating a carrier frequency error of a receiving signal; a timing recovery means for compensating a sampling timing error of the receiving signal; a carrier error reflecting means for reflecting the carrier frequency error extracted from the carrier recovery means to a transmitting signal; and a timing error reflecting means for reflecting the sampling timing error extracted from the timing recovery means to the transmitting signal. The present invention is used to form an on-channel repeating network in any transmission system including a digital television broadcasting system.

20 Claims, 12 Drawing Sheets

U.S. PATENT DOCUMENTS

| | | | |
|---|---|---|---|
| 5,845,196 A * | 12/1998 | Nawata | 455/71 |
| 6,549,587 B1 * | 4/2003 | Li | 375/326 |
| 6,628,738 B1 | 9/2003 | Peeters et al. | |
| 7,149,260 B2 * | 12/2006 | Kim et al. | 375/321 |
| 2004/0237117 A1 | 11/2004 | Park et al. | |

FOREIGN PATENT DOCUMENTS

| | | |
|---|---|---|
| KR | 10-2004-0070885 A | 8/2004 |
| WO | WO95/26074 | 9/1995 |
| WO | WO03/090441 A2 | 10/2003 |
| WO | WO2004/105391 A1 | 12/2004 |
| WO | WO2005/069616 A1 | 7/2005 |

* cited by examiner

APPARATUS AND METHOD FOR CORRESPONDING FREQUENCY SYNCHRONIZATION IN ON-CHANNEL REPEATER

FIELD OF THE INVENTION

The present invention relates to a frequency synchronizing apparatus for an on-channel repeater receiving signals on one channel and distributing the signals on the same channel and a method thereof; add, more particularly, to a frequency synchronizing apparatus for synchronizing the frequency of a transmitting signal with that of a receiving signal by extracting a carrier error and sampling timing error information in a synchronization process of a signal received from a main transmitter or another repeater and reflecting them to the transmitting signal, and a method thereof.

DESCRIPTION OF RELATED ART

Generally, main transmitters and repeaters are arranged based on natural geographical features/objects and service coverage. Repeaters are set up in an area where signals from a main transmitter are weakly received to thereby solve a problem in a weak signal reception area and widen the coverage of signals transmitted from the main transmitter.

FIG. 1 is a diagram illustrating a service employing conventional repeaters, in which repeaters repeat signals by using different frequencies.

As illustrated in FIG. 1, in the service using the conventional repeaters, signals are outputted from a main transmitter based on a transmission frequency A and repeaters 102 to 105 repeat the signals by using other frequencies B, C, D and E which are different from the transmission frequency A. However, the repeaters 102 to 105 shown in FIG. 1, which use different frequencies B, C, D and E, respectively, in order to solve the problem of a weak signal reception area where signals from the main transmitter 101 are weakly received and broaden the service coverage, are quite inefficient in the respect of frequency usage because they require a plurality of frequency bands and many frequency resources.

FIG. 2 is a diagram describing another service employing conventional repeaters. The drawing presents a concept of a service using on-channel repeaters for receiving signals on one channel and distributing the signals on the same channel. In short, the main transmitter 201 outputs signals based on a transmission frequency A and the repeaters repeat the signals in the same frequency A.

The on-channel repeaters 202 to 205 generally removes noise by demodulating radio frequency (RF) signals transmitted from the main transmitter 201 into baseband signals, modulates the noise-free baseband signals into RF signals again, and repeats the RF signals which are the same as the inputted RF signals through an on-channel.

In order to provide the service, receivers should be able to distinguish between signals transmitted from the main transmitter 201 and the signals transmitted from the on-channel repeaters 202 to 205.

In other words, if the signals transmitted from the main transmitter 201 and the signals transmitted from the on-channel repeaters 202 to 205 have a frequency difference that goes out of the signal removal ability of an equalizer of a receiver, the equalizer of the receiver cannot equalize the receiving signals.

Therefore, it should be premised that the frequency of signals transmitted from the main transmitter and the on-channel repeaters should be the same, and technology for fulfilling the premise is in desperate need.

SUMMARY OF THE INVENTION

It is, therefore, an object of the present invention to provide a frequency synchronizing apparatus for synchronizing the frequency of a transmitting signal with the frequency of a receiving signal by extracting a carrier error and sampling timing error information in a synchronization process of a signal received from a main transmitter or another repeater and reflecting them to the transmitting signal in an on-channel repeater, and a method thereof.

Other objects and advantages of the present invention will be understood by the following descriptions and they will be apparent with reference to preferred embodiments of the present invention. Also, it is clear to those skilled in the present invention that the objects and the advantages of the present invention can be easily embodied by the means as claimed and combinations thereof.

In accordance with an aspect of the present invention, there is provided a frequency synchronizing apparatus for an on-channel repeater receiving signals and distributing the signals on one channel, which includes: a carrier recovery unit for correcting a carrier frequency error of a receiving signal; a timing recovery unit for correcting a sampling timing error of the receiving signal; a carrier error reflecting unit for reflecting the carrier frequency error extracted from the carrier recovery unit to a transmitting signal; and a timing error reflecting unit for reflecting the sampling timing error extracted from the timing recovery unit to the transmitting signal.

In accordance with another aspect of the present invention, there is provided a frequency synchronizing apparatus for an on-channel repeater receiving signals and distributing the signals on one channel, which includes: an analog-digital converter for converting an analog receiving signal into a digital signal; a carrier recovery unit for correcting a carrier frequency error of the digital signal; a timing recovery unit for correcting a sampling timing error of the digital signal; a carrier error reflecting unit for reflecting the carrier frequency error extracted from the carrier recovery unit to a transmitting signal; a digital-analog converter for converting the transmitting signal with the carrier frequency error into an analog signal; and a voltage controlling oscillator for reflecting the sampling timing error extracted from the timing recovery unit in an oscillation signal and providing the oscillation signal to the analog-digital converter and the digital-analog converter.

In accordance with another aspect of the present invention, there is provided a frequency synchronizing method for an on-channel repeater receiving signals and distributing the signals on one channel, which includes the steps of: a) correcting a carrier frequency error of a receiving signal; b) correcting a sampling timing error of the receiving signal; c) reflecting the carrier frequency error extracted from the carrier recovery unit to a transmitting signal; and d) reflecting the sampling timing error extracted from the timing recovery unit to the transmitting signal.

In accordance with another aspect of the present invention, there is provided a frequency synchronizing method for an on-channel repeater receiving signals and distributing the signals on one channel, which includes the steps of: a) converting an analog receiving signal into a digital signal; b) correcting a carrier frequency error of the digital signal; c) correcting a sampling timing error of the digital signal; d) reflecting the carrier frequency error extracted from the step b) to a transmitting signal; and e) converting the transmitting signal with the carrier frequency error into an analog signal, wherein the sampling timing error detected in the step c) is equally used in the steps a) and e).

The frequency synchronizing apparatus and method of the present invention can synchronize the frequency of a transmitting signal with that of a receiving signal by extracting a carrier error and sampling timing error information from a receiving signal transmitted from a main transmitter or another repeater and using them for modulation of the transmitting signal.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Figure 1:
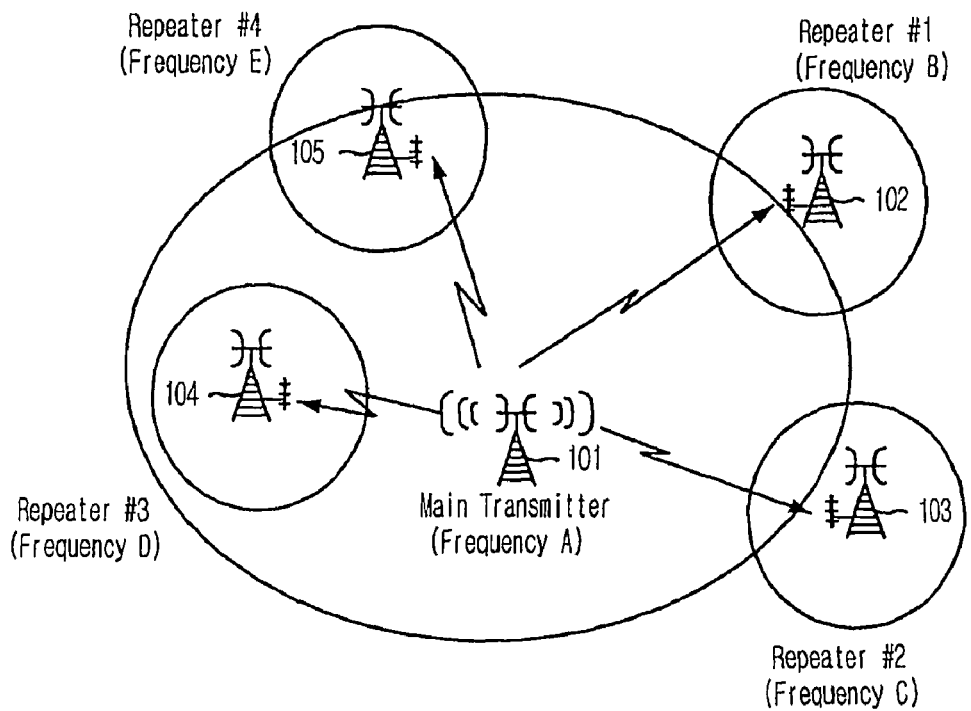
FIG. 1 is a diagram showing a service employing conventional repeaters according to an embodiment of prior art.
Figure 2:
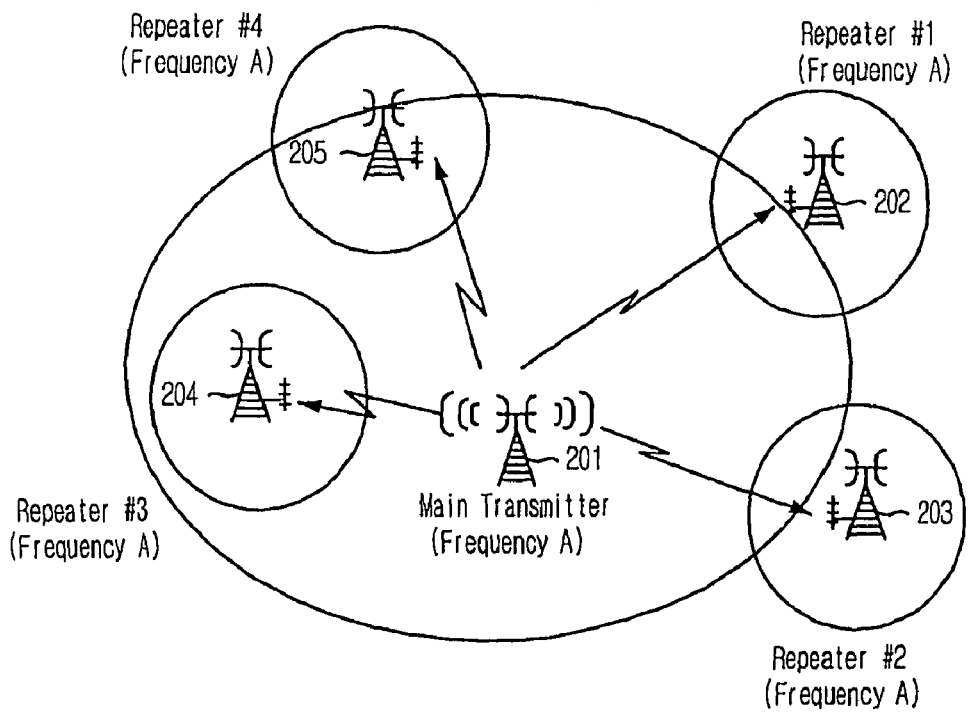
FIG. 2 is a diagram showing a service employing conventional repeaters according to another embodiment of the present invention.

Other objects and aspects of the invention will become apparent from the following description of the embodiments with reference to the accompanying drawings, which is set forth hereinafter. Also, if it is considered that detailed description on prior art related to the present invention may blur the points of the present invention, the description will not be provided herein. Hereinafter, preferred embodiments of the present invention will be described with reference to accompanying drawings. The same reference numeral is used for the same elements performing the same function.

Before the description of the present invention, the frequency synchronizing apparatus and method for an on-channel repeater, which is suggested in the present invention, is suitable for digital television broadcasting, the Advanced Television System Committee (ATSC), and the Digital Video Broadcasting (DVB), but the present invention is not limited to the above field and it can be applied to an environment requiring a repeater to form a general single frequency network.

Figure 3:
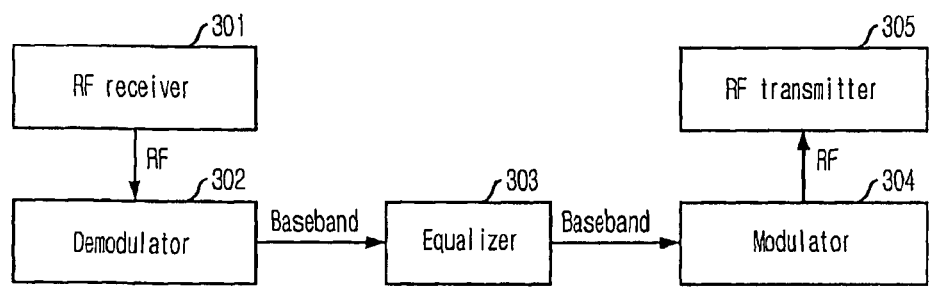
FIG. 3 is a block diagram illustrating an on-channel repeater in accordance with an embodiment of the present invention.

FIG. 3 is a block diagram illustrating an on-channel repeater in accordance with an embodiment of the present invention. As shown in FIG. 3, the on-channel repeater includes an RF receiver 301 for receiving radio frequency (RF) signals transmitted from a main transmitter or another repeater, a demodulator 302 for converting the RF signals received in the RF receiver 301 into baseband signals, an equalizer 303 for equalizing the baseband signals converted in the demodulator 302 to correct distortion caused in a transmission channel, a modulator 304 for converting the baseband signals equalized in the equalizer 303 into RF signals, and an RF transmitter 305 for transmitting modulated RF signals.

Hereafter, the on-channel repeater of FIG. 3 will be described more in detail. First, the RF receiver 301 receives the RF signals transmitted from the main transmitter, and the received RF signals are converted into the baseband signals in the demodulator 302. Then, noise and multi-path signals which are generated in a transmission line between the main transmitter and the on-channel repeater and the feedback signals generated due to low isolation of the transmitting/receiving antenna of the on-channel repeater are removed from the converted baseband signals in the equalizer 303. The baseband signals which are free from the noise, multipath signals and the feedback signals are converted into RF signals in the modulator 304, and the converted RF signals are transmitted in the RF transmitter 305.

Figure 4:
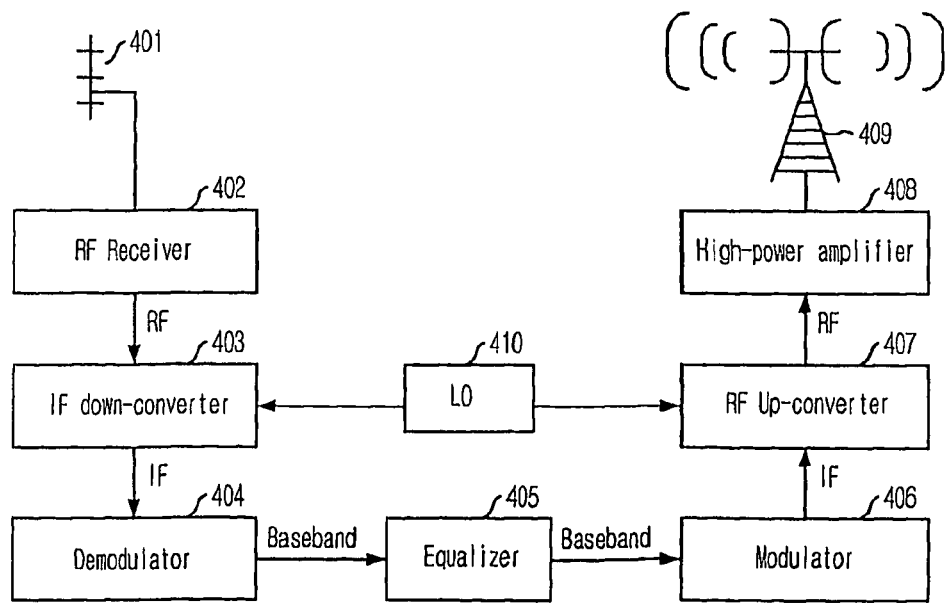
FIG. 4 is a block diagram describing an on-channel repeater in accordance with another embodiment of the present invention.

FIG. 4 is a block diagram describing an on-channel repeater in accordance with another embodiment of the present invention. The on-channel repeater of FIG. 4 includes a receiving antenna 401, an RF receiver 402, an intermediate frequency (IF) down-converter 403, a demodulator 404, an equalizer 405, a modulator 406, an RF up-converter 407, a high-power amplifier 408, a transmitting antenna 409, and a local oscillator (LO) 410.

The RF receiver 402 receives the RF signals transmitted from the main transmitter through the receiving antenna 401, and the IF down-converter 403 down-converts the frequency of the received RF signals into IF signals based on the reference frequency provided from the LO 410.

The demodulator 404 demodulates the frequency down-converted IF signals into baseband signals, and the equalizer 405 corrects signal distortion generated in the transmission channel by equalizing the demodulated baseband signals and removes feedback signals generated due to low isolation of the transmitting/receiving antenna of the on-channel repeater.

The modulator 406 modulates the equalized baseband signals into IF signals, and the RF up-converter 407 up-converts the IF signals into RF signals based on the reference frequency provided from the LO 410. Also, the high-power amplifier 408 amplifies the frequency up-converted RF signals, and the transmitting antenna 409 transmits the amplified RF signals.

Herein, the frequency of the transmitting signals from the on-channel repeater of FIGS. 3 and 4 should be the same as the frequency of the signals transmitted from the main transmitter or another repeater. The receiving signals and the transmitting signals can be synchronized by using an external reference signal or using carrier error information and sampling timing error information of a receiving signal.

Figure 5:
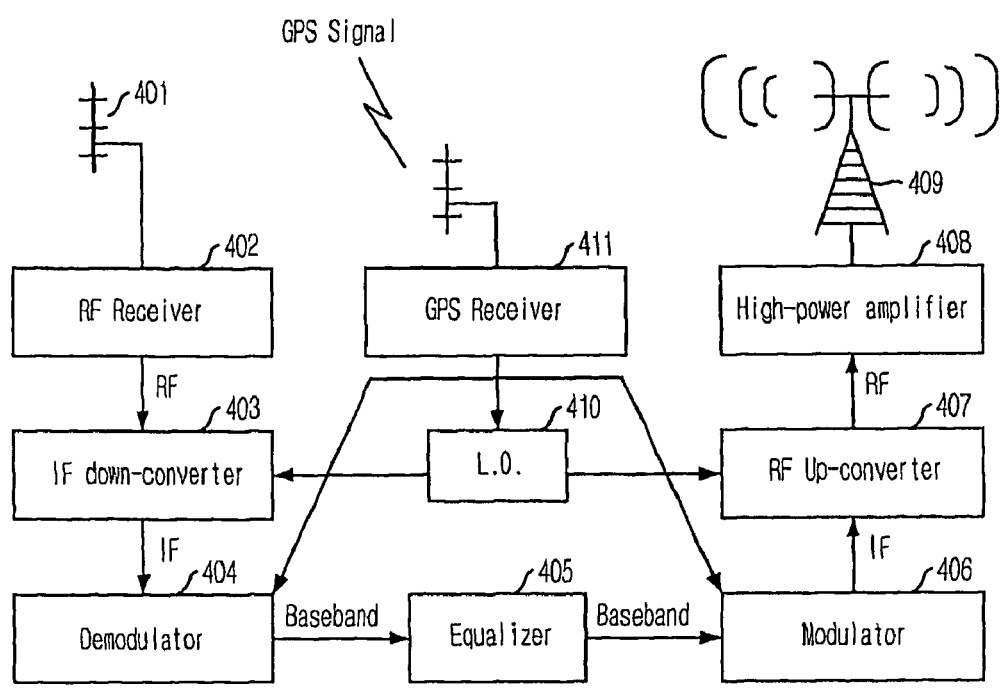
FIG. 5 is a block diagram depicting an on-channel repeater synchronizing the frequency of a transmitting signal with that of a receiving signal by using a Global Positioning System (GPS) signal in accordance with an embodiment of the present invention.

FIG. 5 is a block diagram describing an on-channel repeater synchronizing the frequency of a transmitting signal with that of a receiving signal by using a Global Positioning System (GPS) signal in accordance with an embodiment of the present invention. The on-channel repeater further includes a GPS receiver 411.

The GPS receiver 411 divides a GPS reference signal received from the outside and provides oscillation signals needed for analog-digital conversion (ADC) of the demodulator 404 and the digital-analog conversion (DAC) of the modulator 406. Also, the GPS receiver 411 divides the received GPS reference signal and provides the signal to the LO 410. The LO 410 provides reference frequency to the IF down-converter 403 and the RF up-converter 407 based on the GPS reference signal.

Meanwhile, the main transmitter receives the same GPS reference signal as the GPS reference signal received in the on-channel repeater of FIG. 5, and it is used to convert digital signals into analog signals or up-convert converted analog signals into RF signals.

Thus, the frequency of the signal transmitted from the main transmitter becomes the same as the frequency of the signals transmitted from the transmitting antenna of the on-channel repeater of FIG. 4. However, there is a trouble that the GPS receiver should be set up additionally in the main transmitter and the on-channel repeaters.

The digital signals generated in the inside of the main transmitter go through digital-analog conversion, is up-converted into a predetermined RF frequency, and is transmitted through antenna. Herein, when a theoretical value of the predetermined RF frequency is assumed to be $f_c$, the actual frequency is $(f_c+\Delta f_c)$ The frequency difference $\Delta f_c$ is originated from an error of the LO used for digital-analog conversion and frequency conversion in the main transmitter. Therefore, since the frequency of a receiving signal inputted into the on-channel repeater is $(f_c+\Delta f_c)$, the transmitting signal of the on-channel repeater should have the frequency $(f_c+\Delta f_c)$.

Meanwhile, the frequency used for frequency up-conversion or down-conversion of analog signals in the on-channel repeater should be diverged from the same local oscillator. This has no concern with the frequency error $\Delta f_c$ of the receiving signal, and this is to prevent a third frequency error that can be generated before and after the frequency down-conversion of the receiving signal and the frequency up-conversion of the transmitting signal. However, it is ordinary to use one local oscillator to perform frequency conversion in a single system, and it is not a core device for synchronizing the frequency of the transmitting with that of receiving signals.

The frequency synchronizing apparatus for an on-channel repeater, which is suggested in the present invention, can be classified into a digital type when fixed voltage is used as an input to a voltage controlling oscillator providing an oscillation frequency used for analog-digital conversion and digital-analog conversion and into a digital-analog type when an output from the timing recovery unit is used.

Figure 6:
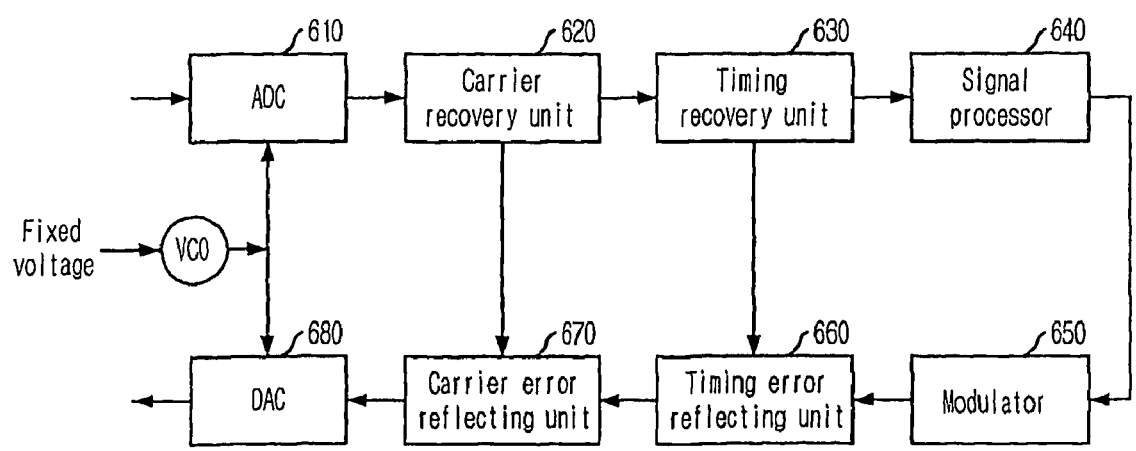
FIG. 6 is a block diagram illustrating a digital frequency synchronizing apparatus for an on-channel repeater in accordance with an embodiment of the present invention.

FIG. 6 is a block diagram illustrating a digital frequency synchronizing apparatus for an on-channel repeater in accordance with an embodiment of the present invention. As illustrated in FIG. 6, the digital frequency synchronizing apparatus for an on-channel repeater, which is suggested in the present invention, is provided with an oscillation frequency from a voltage controlled oscillator 690 which uses a fixed voltage as an input when signals are converted in an analog-digital converter (ADC) 610 and a digital-analog converter (DAC) 680.

A carrier recovery unit 620 and a timing recovery unit 630 which are illustrated in FIG. 6, compensate a carrier error and a sampling timing error, which will be referred to as a timing error hereinafter, in the receiving signals which are converted into digital signals in the analog-digital converter 610, and the error-compensated signals are modulated in a modulator 650 through a signal processor 640 including symbol recovery and equalization processes. Herein, since the modulated signals do not include the frequency error which existed in the signals inputted to the analog-digital converter 610, the frequency error is reflected to the modulated signals in a timing error reflecting unit 660 and a carrier error reflecting unit 670. In short, the carrier frequency error and the timing error extracted from the carrier recovery unit 620 and the timing recovery unit 630 are reflected to the transmitting signals in the carrier error reflecting unit 670 and the timing error reflecting unit 660.

Figure 7:
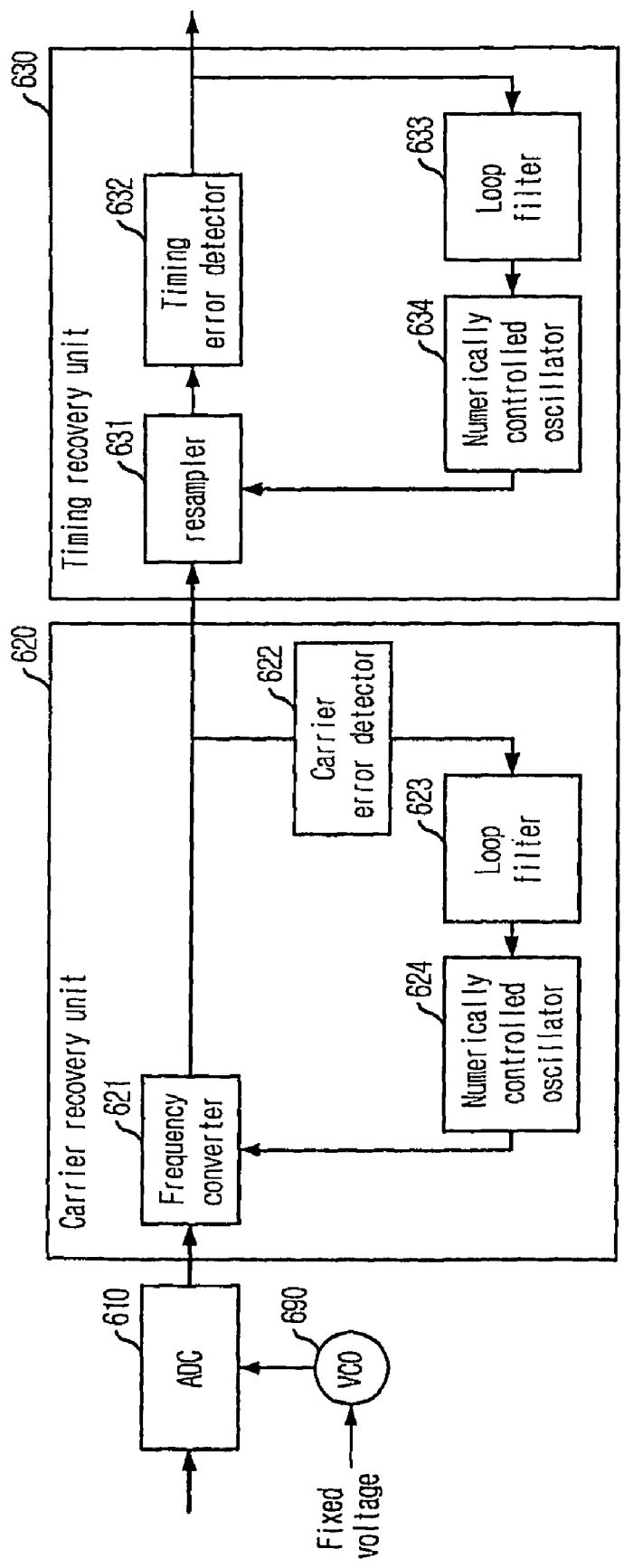
FIG. 7 is a block diagram showing a carrier recovery unit and a timing recovery unit of FIG. 6 in accordance with an embodiment of the present invention.

FIG. 7 is a block diagram showing the carrier recovery unit and the timing recovery unit of FIG. 6 in accordance with an embodiment of the present invention. The carrier recovery unit 620 of FIG. 6 includes a frequency converter 621, a carrier error detector 622, a loop filter 623, and a numerically controlled oscillator 624, and the timing recovery unit 630 of FIG. 6 includes a resampler 631, a timing error detector 632, a loop filter 633, and a numerically controlled oscillator 634. However, the carrier recovery unit 620 and the timing recovery unit 630 can use diverse algorithms and the location of them can be changed according to the employed algorithm.

The carrier recovery unit 620 compensates carrier frequency and phase errors after a certain time passes and the carrier acquisition process is completed. In other words, the carrier error detector 622 detects a carrier phase error in an inputted receiving signal by using diverse algorithms according to an error detection scheme, and the loop filter 623 accumulates carrier phase errors detected in the carrier error detector 622 and outputs a uniform average error value. The numerically controlled oscillator 624 converts the accumulated error value into a frequency value. Then, the frequency converter 621 performs complex multiplication on the inputted receiving signals and the frequency value and moves the center frequency of the inputted receiving signal as much as the frequency value. Herein, the quality (quantity of phase jitter) of the frequency value can be adjusted by the bandwidth of the loop filter 623. The narrower the bandwidth is, the smaller the quantity of phase jitter is, thus the quality of the frequency value is improved.

Meanwhile, the timing recovery unit 630 compensates the timing frequency and phase errors after a certain time passes and a timing acquisition process is completed. In short, the timing error detector 632 detects timing phase errors in an inputted receiving signal by using diverse algorithms according to an error detection scheme. The loop filter 633 accumulates the timing phase errors detected in the timing error detector 632 and outputs a uniform average error value, and the numerically controlled oscillator 634 converts the accumulated error value into a sample rate. Then, the resampler 631 resamples the inputted receiving signal based on the converted sample rate. Herein, the quality (quantity of phase jitter) of the sample rate can be adjusted by the bandwidth of the loop filter 633. The narrower the bandwidth is, the quantity of phase jitter is decreased, thus the quality of the sample rate is improved.

Figure 8:
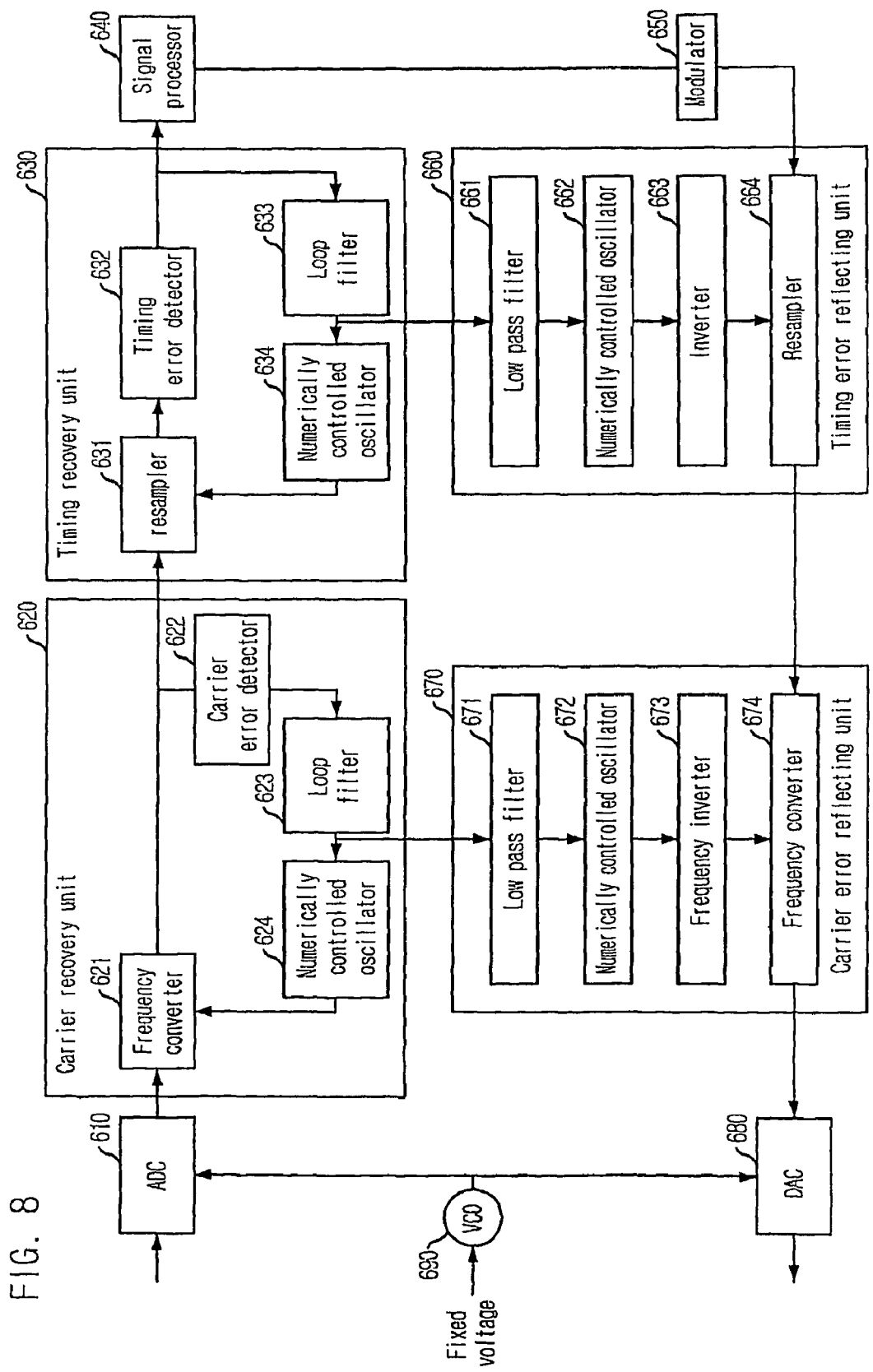
FIG. 8 is a block diagram describing a carrier error reflecting unit and a timing error reflecting unit of FIG. 6 in accordance with an embodiment of the present invention.

FIG. 8 is a block diagram describing a carrier error reflecting unit and a timing error reflecting unit of FIG. 6 in accordance with an embodiment of the present invention. The carrier error reflecting unit 670 and the timing error reflecting unit 660 reflects the carrier frequency error and timing error to a transmitting signals by using an error value outputted from the loop filters 623 and 633 of the carrier recovery unit 620 and the timing recovery unit 630 of FIG. 7.

When a theoretical center frequency of a receiving signal inputted to the frequency converter 621 of the carrier recovery unit 620 is $f_c$ and the actual center frequency is $(f_c + \Delta f_c)$ and a theoretical frequency of an output signal from the frequency converter 621 is 0, the frequency converter 621 of the carrier recovery unit 620 moves the center frequency $(f_c + \Delta f_c)$ to the left to offset the frequency error as much as $+\Delta f_c$.

When a theoretical center frequency of a transmitting signal inputted to the carrier error reflecting unit 670 is 0 and a theoretical center frequency of the outputted transmitting signal is $f_t$, the carrier error reflecting unit 670 moves the center frequency to the right as much as $(f_t + \Delta f_c)$, which is opposite to operation in the carrier recovery unit 620, to reflect the frequency error $+\Delta f_c$ of the receiving signal.

In short, the carrier error reflecting unit 670 of FIG. 8 includes a low pass filter 671, a numerically controlled oscillator 672, a frequency inverter 673, and a frequency converter 674. The numerically controlled oscillator 672 converts the error value outputted from the loop filter 622 of the carrier recovery unit 620 into a frequency value, and the frequency inverter 673 inverts the sign of the frequency value outputted from the numerically controlled oscillator 672. The frequency converter 674 shifts frequency of the transmission signal by reflecting the inverted frequency value. Herein, the sign inversion of the frequency value signifies multiplying a sine part by −1 when the output of the numerically controlled oscillator 672 is formed of a cosine value and a sine value. The low pass filter 671 controls the quantity of phase jitter added to the transmitting signal and it is not necessarily required.

Meanwhile, when a theoretical sampling frequency of a receiving signal inputted to the resampler 631 of the timing recovery unit 630 is $f_i$ and an actual sampling frequency is $(f_i + \Delta f_i)$ and a theoretical sampling frequency of the signal outputted from the resampler 631 is $f_s$, the output of the numerically controlled oscillator 634 of the timing recovery unit 630 should be $$\frac{f_s}{(f_i + \Delta f_i)}.$$

When the resampler 631 resamples the receiving signal at a rate of $$\frac{f_s}{(f_i + \Delta f_i)},$$

the sampling frequency of an output signal of the resampler 631 comes to $f_s$ and $\Delta f_i$ is offseted.

In order for the sampling frequency of a transmitting signal outputted from the timing error reflecting unit 660 to be the same as the sampling frequency $(f_i + \Delta f_i)$ of the receiving signal inputted to the timing recovery unit 630, the timing error reflecting unit 660 should resample the transmitting signal at a rate of $$\frac{(f_i + \Delta f_i)}{f_s}.$$

In short, the timing error reflecting unit 660 of FIG. 8 includes a low pass filter 661, a numerically controlled oscillator 662, an inverse converter 663, and a resampler 664. The numerically controlled oscillator 662 converts the error value outputted from the loop filter 632 of the timing recovery unit 630 into a sample rate, and the inverse converter 663 inverse converts the sample rate outputted from the numerically controlled oscillator 662. The resampler 664 resamples the transmitting signal according to the inverse converted sample rate. Herein, when the inputted signal is a, the inverse converter 663 outputs 1/a, and the low pass filter 661, which controls the quantity of phase jitter added to the transmitting signal, is not necessarily required.

Figure 9:
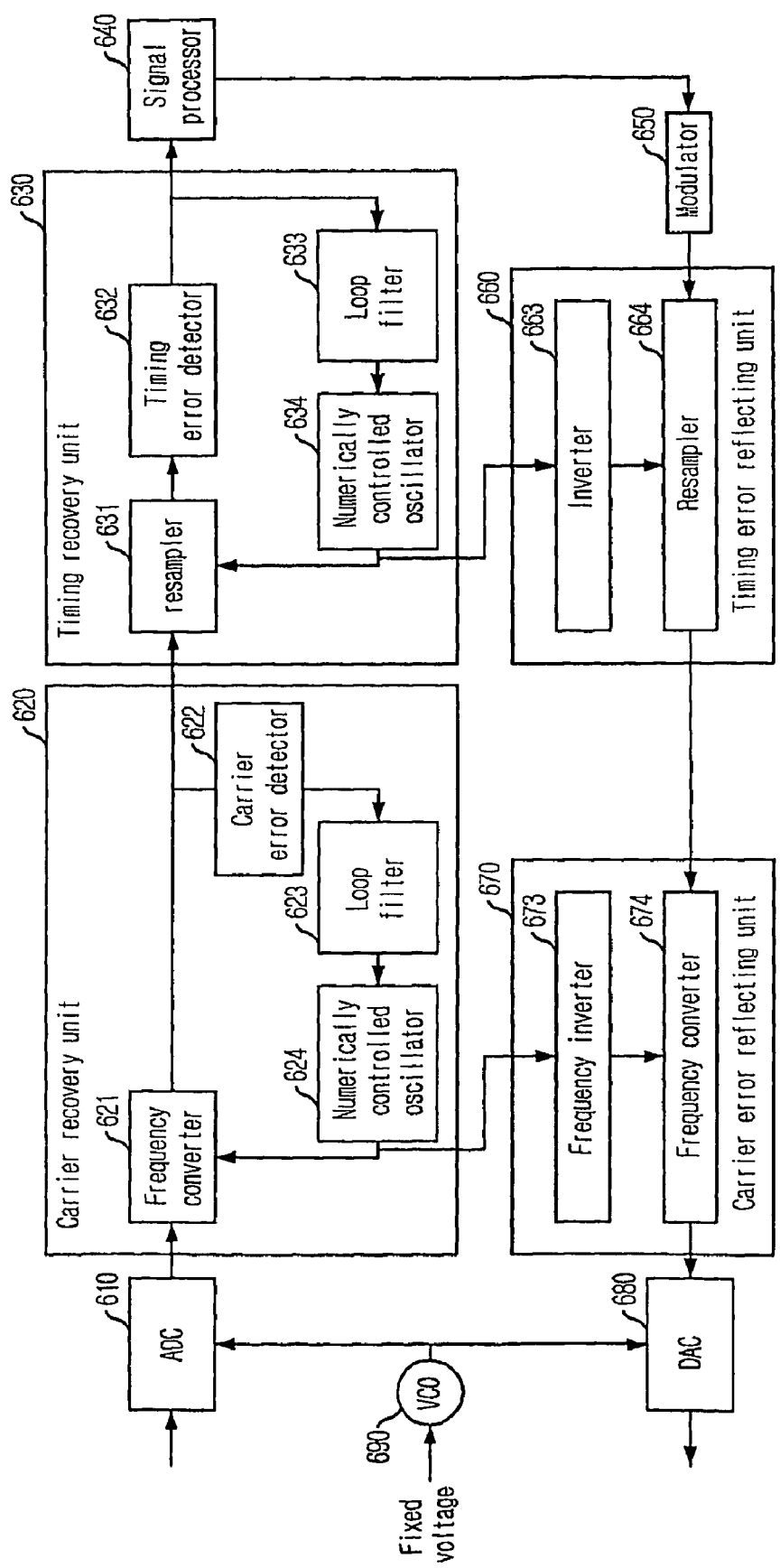
FIG. 9 is a block diagram describing a carrier error reflecting unit and a timing error reflecting unit of FIG. 6 in accordance with another embodiment of the present invention.

FIG. 9 is a block diagram describing the carrier error reflecting unit and the timing error reflecting unit of FIG. 6 in accordance with another embodiment of the present invention. The carrier error reflecting unit 670 and the timing error reflecting unit 660 reflects the carrier error and timing error to the transmitting signal by using a signal outputted from the numerically controlled oscillators 624 and 634 of the carrier recovery unit 620 and the timing recovery unit 630.

In other words, if the structure and the fundamental frequency of the numerically controlled oscillator 672 of the carrier error reflecting unit 670 of FIG. 8 are the same as the structure and the fundamental frequency of the numerically controlled oscillator 624 of the carrier recovery unit 620, the carrier error reflecting unit 670 can be formed by using only the frequency inverter 673 and the frequency converter 674. Herein, the fundamental frequency of the numerically controlled oscillators 624 and 672 is the output value when the input is 0.

Also, if the structure and the fundamental sample rate of the numerically controlled oscillator 662 of the timing error reflecting unit 660 of FIG. 8 are the same as the structure and the fundamental sample rate of the numerically controlled oscillator 634 of the timing recovery unit 630, the timing error reflecting unit 660 can be formed by using only the inverse converter 663 and the resampler 664. Herein, the fundamental sample rate of the numerically controlled oscillators 634 and 662 are the output value when the input is 0.

Meanwhile, the carrier error reflecting unit 670 and the timing error reflecting unit 660 of FIG. 8 use signals outputted from the loop filters 623 and 633 of the carrier recovery unit 620 and the timing recovery unit 630, respectively. The carrier error reflecting unit 670 and the timing error reflecting unit 660 of FIG. 9 use signals outputted from the numerically controlled oscillator 624 an 634 of the carrier recovery unit 620 and the timing recovery unit 630, respectively. However, it is obvious to those skilled in the art that it is possible to assemble the carrier error reflecting unit 670 of FIG. 8 and the timing error reflecting unit 660 of FIG. 9 and to assemble the carrier error reflecting unit 670 of FIG. 9 and the timing error reflecting unit 660 of FIG. 8.

Figure 10:
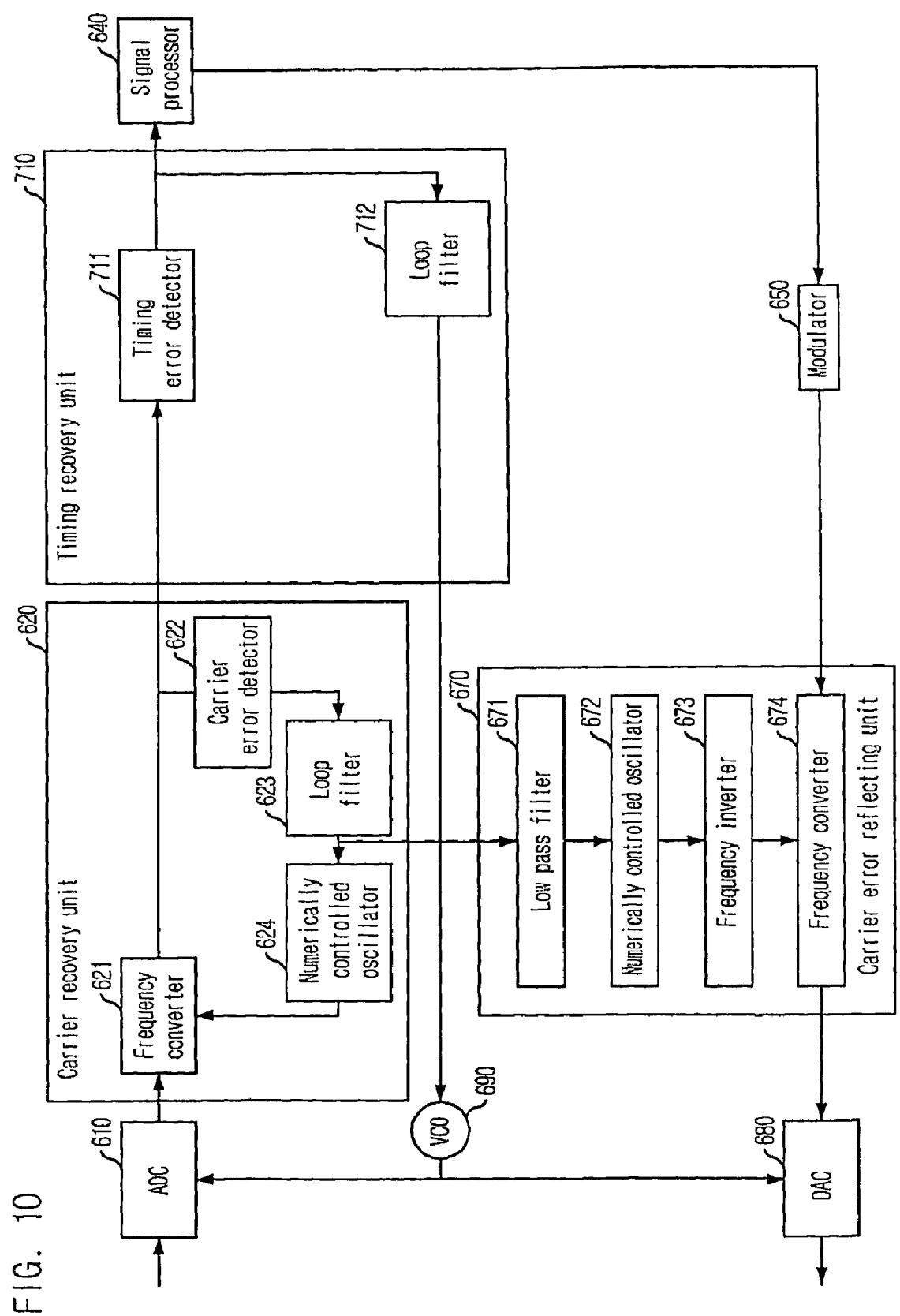
FIG. 10 is a block diagram illustrating a digital-analog frequency synchronizing apparatus for an on-channel repeater in accordance with an embodiment of the present invention.

FIG. 10 is a block diagram illustrating a digital-analog frequency synchronizing apparatus for an on-channel repeater in accordance with an embodiment of the present invention. The carrier recovery unit 620 and the carrier error reflecting unit 670 of FIG. 10 are the same as the carrier recovery unit 620 and the carrier error reflecting unit 670 of FIG. 8 in their structure, but it is obvious to those skilled in the art that The carrier recovery unit 620 and the carrier error reflecting unit 670 of FIG. 10 have the structures of the carrier recovery unit 620 and the carrier error reflecting unit 670 of FIG. 9.

Meanwhile, the timing recovery unit 710 of FIG. 10 includes the timing error detector 711 and the loop filter 712, and it detects a timing error in the inputted receiving signal, accumulates the detected timing errors, and provides a uniform average error value to the voltage controlled oscillator 720. The voltage controlled oscillator 720 provides oscillation frequency to the analog-digital converter 610 and the digital-analog converter 680 based on the timing error inputted from the loop filter 712 to thereby reflect the timing error of the receiving signal to the transmitting signal.

Figure 11:
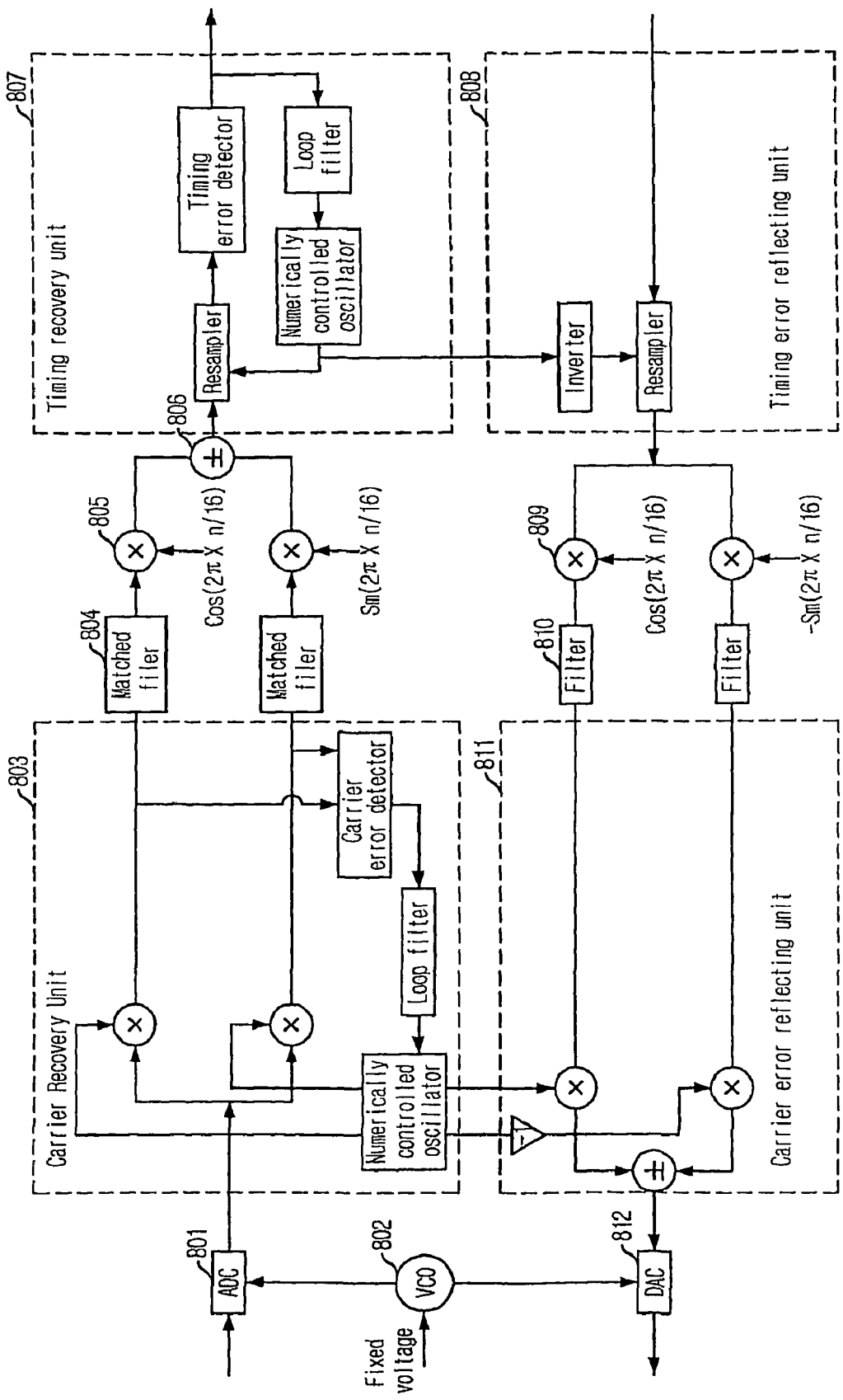
FIG. 11 is a block diagram illustrating a digital frequency synchronizing apparatus for an on-channel repeater in accordance with an embodiment of the present invention.

FIG. 11 is a block diagram illustrating a digital frequency synchronizing apparatus for an on-channel repeater in accordance with an embodiment of the present invention. The analog-digital converter (ADC) 801 converts an analog signal into a digital signal based on a clock signal provided from a voltage controlled oscillator (VCO) 802 whose input is a fixed voltage.

The carrier recovery unit 803 converts the converted digital signal into an In-phase (I) signal and a Quadrature-phase (Q) signal, extracts a carrier frequency error, and shifts the center frequencies of the I and Q signals to zero (0) individually. In short, the carrier recovery unit 803 shifts the pilot components of the I and Q signals by −2.69 MHz.

The matched filter 804 maximizes the signal-to-noise ratio by performing matched filtering on the I and Q signals whose center frequencies are shifted to zero. A first up-converter 805 up-converts the filtered I and Q signals in such a manner that the center frequencies of the I and Q signals are laid in a baseband. That is, the first up-converter 805 shifts the pilot components of the filtered I and Q signals to 0 frequency individually.

An adder 806 adds the frequency up-converted I and Q signals, and restores baseband signals. The timing recovery unit 807 compensates sampling timing error of the restored baseband signal. The signals free from the carrier frequency error and the timing error go through signal processing such as symbol restoration and equalization.

The timing error reflecting unit 808 reflects the timing error extracted from the timing recovery unit 807 to the processed signal. In short, the processed signal is resampled according to a sample rate based on the timing error.

The resampled signal is transformed to I and Q signal. A first down-converter 809 down-converts the I and Q signals, and shifts the center frequencies of the I and Q signals to zero. In short, the respective pilot components are shifted to −2.69 MHz.

A filter 810 filter the frequency down-converted I and Q signals, and a carrier error reflecting unit 811 inversely reflects the carrier frequency error extracted from the carrier recovery unit 803 to the filtered I and Q signals while up-converting them.

A digital-analog converter 812 converts the signal reflected with the carrier frequency error into an analog signal based on a clock signals provided from a voltage controlled oscillator 802 whose input is a fixed voltage.

Although the carrier recovery unit 803, the timing recovery unit 807, the carrier error reflecting unit 811 and the timing error reflecting unit 808 of the embodiment of FIG. 11 employ the structures of FIG. 9, they can be realized to have the structures of FIG. 8 as well. Also, it is possible that they can be realized by combining the structures of FIGS. 8 and 9.

Figure 12:
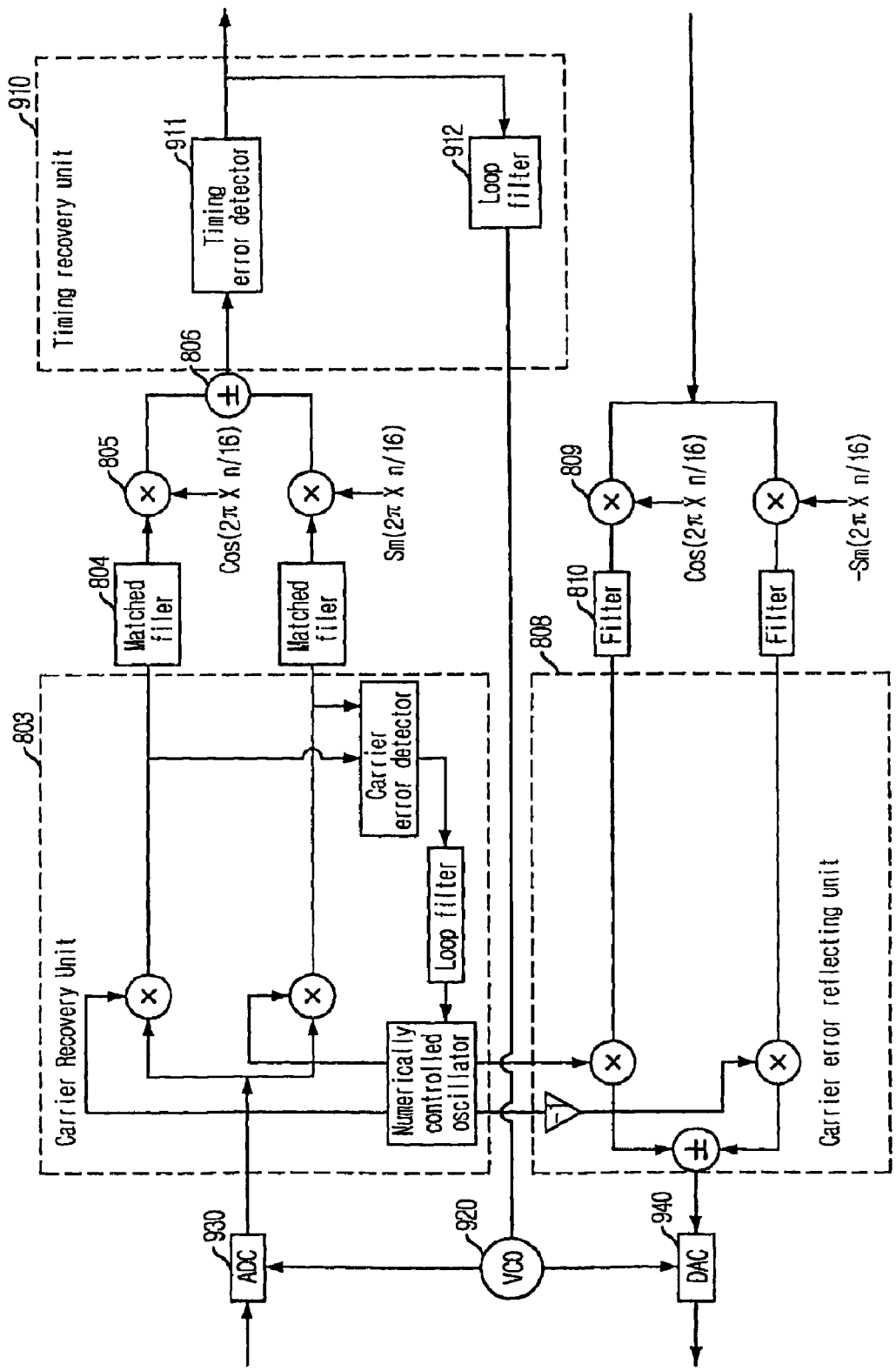
FIG. 12 is a block diagram illustrating a digital-analog frequency synchronizing apparatus for an on-channel repeater in accordance with another embodiment of the present invention.

FIG. 12 is a block diagram illustrating a digital-analog frequency synchronizing apparatus for an on-channel repeater in accordance with another embodiment of the present invention. Differently from FIG. 11, the timing recovery unit 910 includes a timing error detector 911 and a loop filter 912, and a voltage controlled oscillator 920 provides oscillation frequency to an analog-digital converter 930 and a digital-analog converter 940 based on a timing error outputted from the loop filter 912 of the timing recovery unit 910. Although the carrier recovery unit 803 and the carrier error reflecting unit 808 are realized in the same structures as shown in FIG. 9, they can be realized in the structures of FIG. 8.

Figure 13:
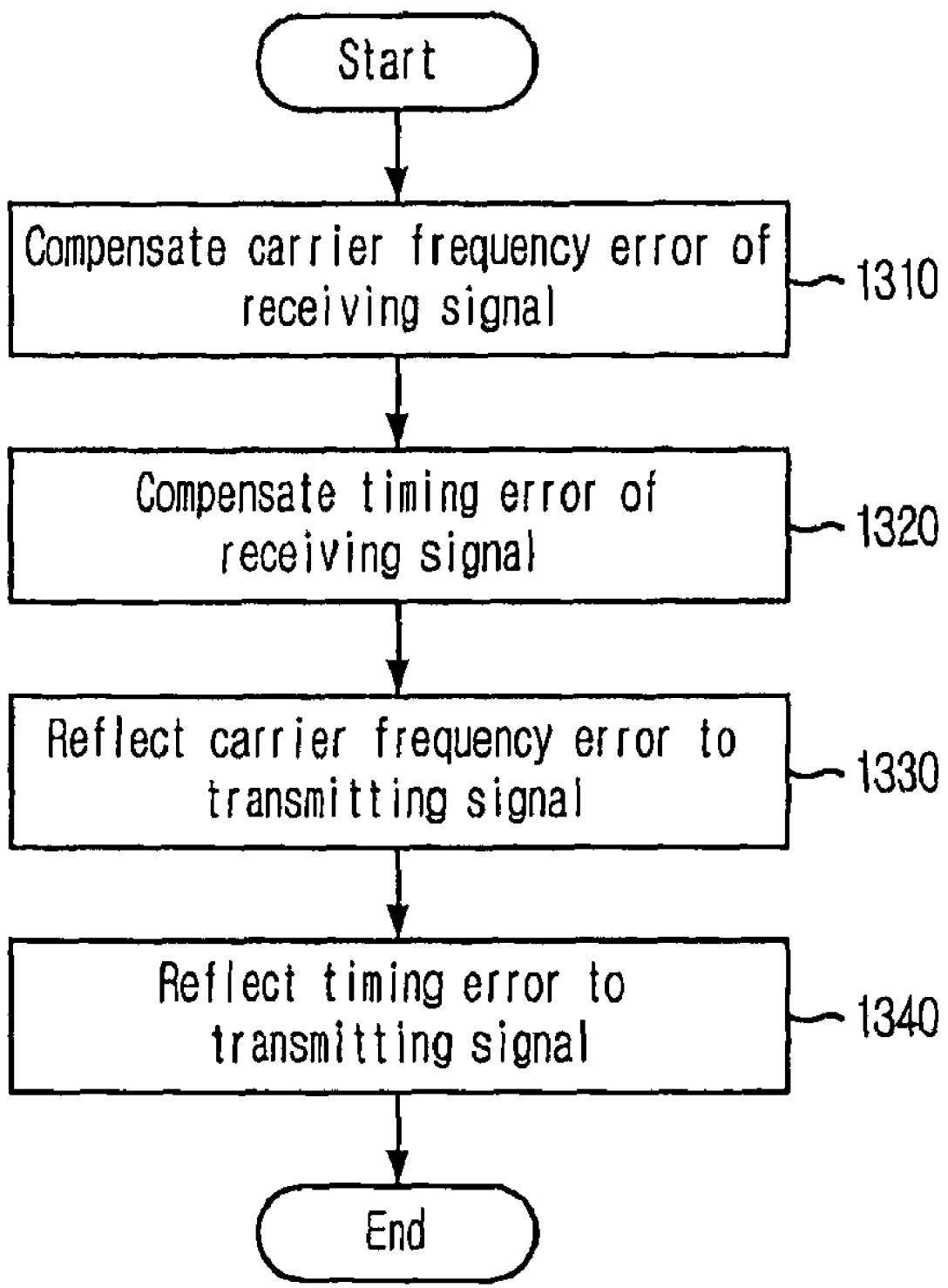
FIG. 13 is a flowchart describing a digital frequency synchronizing method for an on-channel repeater in accordance with an embodiment of the present invention.

FIG. 13 is a flowchart describing a digital frequency synchronizing method for an on-channel repeater in accordance with an embodiment of the present invention.

As illustrated in FIG. 13, at step 1310, first, a carrier frequency error of a signal transmitted from the main transmitter or another on-channel repeater is compensated and, at step 1320, a timing error is compensated.

Although diverse algorithms can be embodied to compensate the carrier frequency error, as shown in FIG. 7, the carrier error detector 622 detects a carrier phase error in an inputted receiving signal and the loop filter 623 accumulates the detected carrier phase error and outputs a uniform average error value. Then, the numerically controlled oscillator 624 converts the error value into a frequency value and the frequency converter 621 compensates the carrier frequency error by shifting the center frequency of the inputted receiving signal as much as the frequency value.

In short, when a theoretic center frequency of the receiving signal inputted to the frequency converter 621 of the carrier recovery unit 620 is $f_c$ and the actual center frequency is $(f_c+\Delta f_c)$ and a theoretic frequency of signal outputted from the frequency converter 621 is zero, the frequency converter 621 of the carrier recovery unit 620 shifts the center frequency to the left as much as $(f_c+\Delta f_c)$ to offset the frequency error $+\Delta f_c$.

Although diverse algorithms can be embodied to compensate a timing error, as shown in FIG. 7, the timing error detector 623 detects a timing phase error in the inputted receiving signal, and the loop filter 633 accumulates the detected timing phase error and outputs a uniform average error value. Then, the numerically controlled oscillator 634 converts the error value into a sample rate and the resampler 631 resamples the inputted receiving signal according to the sample rate and compensates the timing error.

In short, when a theoretic sampling frequency of the receiving signal inputted to the resampler 631 of the timing recovery unit 620 is $f_i$ and the actual sampling frequency is $(f_i+\Delta f_i)$ and a theoretic sampling frequency of the signal outputted from the resampler 631 is $f_s$, the output of the numerically controlled oscillator 634 of the timing recovery unit 630 should be $$\frac{f_s}{(f_i + \Delta f_i)}.$$

When the resampler 631 resamples the receiving signal at a rate of $$\frac{f_s}{(f_i + \Delta f_i)},$$

the output signal of the resampler 631 has a sampling frequency $f_s$ to thereby offset the $\Delta f_i$.

Subsequently, at step 1330, the carrier frequency error extracted from the carrier frequency error compensating process is reflected in the transmitting signal and, at step 1340, the timing error extracted from the timing error compensating process is reflected in the transmitting signal. Thus, the signals transmitted from an on-channel repeater are synchronized with the signals transmitted from the main transmitter or another on-channel repeater.

Figure 14:
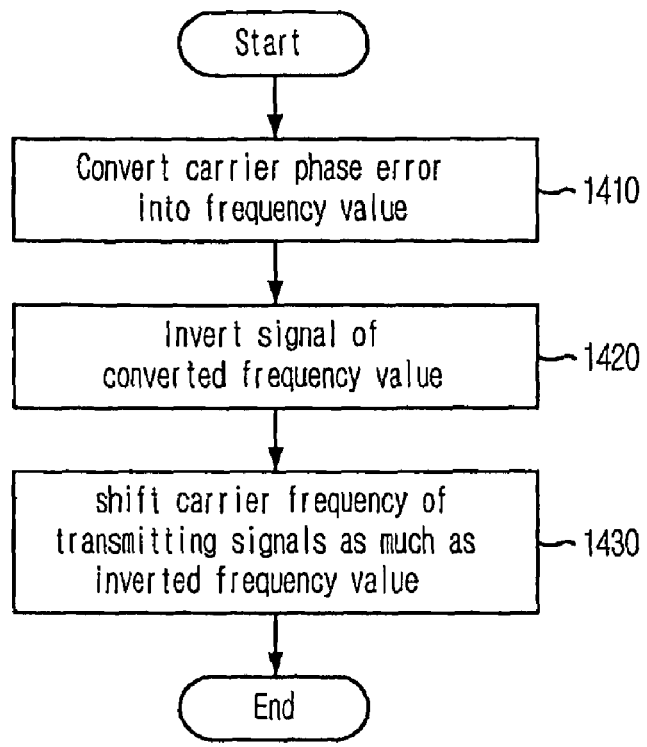
FIG. 14 is a flowchart describing a carrier frequency error reflecting method of FIG. 13 in accordance with an embodiment of the present invention.

FIG. 14, which is a flowchart describing a carrier frequency error reflecting method of FIG. 13 in accordance with an embodiment of the present invention, reflects the carrier frequency error to the transmitting signal by using the average carrier phase error accumulated in and outputted from the loop filter 623 in the carrier frequency error compensating process.

As illustrated in FIG. 14, at step 1410, the carrier phase error accumulated in and averagely outputted from the loop filter 623 is converted into a frequency value and, at step 1420, the sign of the frequency value is inverted. At step 1430, the carrier frequency of the transmitting signal is shifted as much as the sign-inversed frequency value. In short, when a theoretic center frequency of the inputted transmission signal is 0 and a theoretic center frequency of the outputted transmission signal is $f_t$, the center frequency should be shifted to the right by $(f_t+\Delta f_c)$, which is opposite to the carrier frequency error compensation, to reflect the frequency error $\Delta f_c$ of the receiving signal transmitted from the main transmitter or another repeater to the transmitting signal.

Meanwhile, a low pass filtering process can be further included to reduce the phase jitter of the carrier phase error which is accumulated in and averagely outputted from the loop filter 623.

Figure 15:
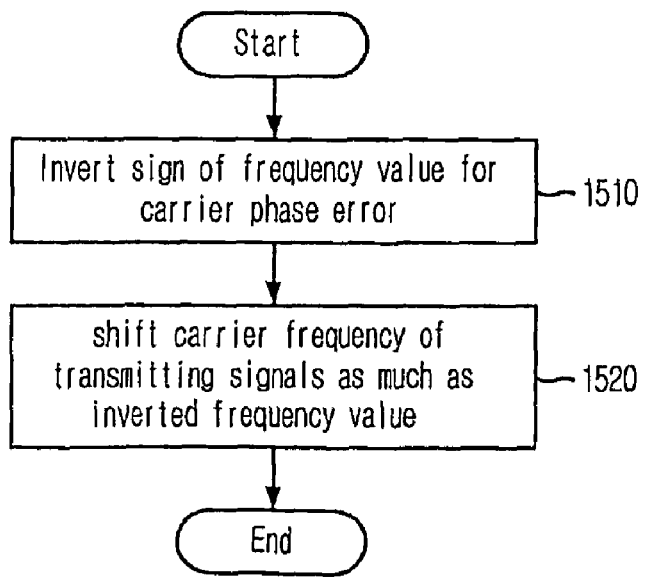
FIG. 15 is a flowchart describing a carrier frequency error reflecting method of FIG. 13 in accordance with another embodiment of the present invention.

FIG. 15, which is a flowchart describing a carrier frequency error reflecting method of FIG. 13 in accordance with another embodiment of the present invention, reflects the carrier frequency error to the transmitting signal by using the frequency value outputted from the numerically controlled oscillator 623 in the carrier frequency error compensation process.

As shown in FIG. 15, first, at step 1510, the sign of the frequency value for the carrier phase error outputted from the numerically controlled oscillator 624 is inverted. Then, at step 1520, the carrier frequency of the transmitting signal is shifted by the sign-inverted frequency value.

Figure 16:
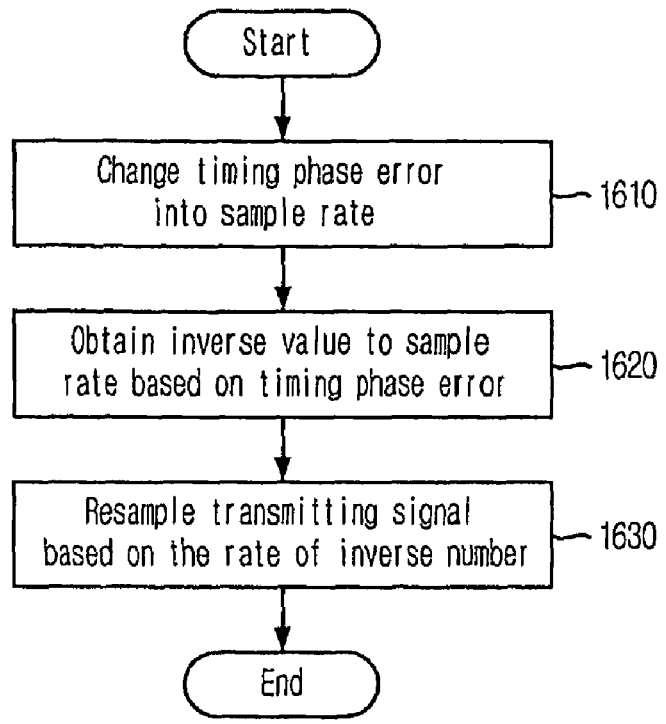
FIG. 16 is a flowchart describing a timing error reflecting method of FIG. 13 in accordance with an embodiment of the present invention.

FIG. 16, which is a flowchart describing a timing error reflecting method of FIG. 13 in accordance with an embodiment of the present invention, reflects the timing error in a transmitting signal by using the timing phase error which is accumulated in and averagely outputted from the loop filter 633 in the timing error compensation process.

As illustrated in FIG. 16, first, at step 1610, the timing phase error accumulated in and averagely outputted from the loop filter 633 into a sample rate. In short, when a theoretic sampling frequency of the receiving signal transmitted from the main transmitter or another repeater is $f_i$ and the actual sampling frequency is $(f_i+\Delta f_i)$ and the timing error-compensated sampling frequency is $f_s$, the sample rate is $$\frac{f_s}{(f_i + \Delta f_i)}.$$

Subsequently, at step 1620, an inverse number to the sample rate is obtained. That is, $$\frac{(f_i + \Delta f_i)}{f_s},$$

which is an inverse number of the $$\frac{f_s}{(f_i + \Delta f_i)},$$

is obtained.

At step 1630, the transmitting signal is resampled at a rate of the inverse number. In short, when the sampling frequency of the timing error-compensated transmitting signal is $f_s$ and the transmitting signal is resampled at a rate of $$\frac{(f_i + \Delta f_i)}{f_s},$$

the result becomes the same as the sampling frequency $(f_i+\Delta f_i)$ of the receiving signal transmitted from the main transmitter or another repeater.

Meanwhile, a low pass filtering process can be further included to reduce phase jitter of the timing phase error accumulated in and outputted from the loop filter 633.

Figure 17:
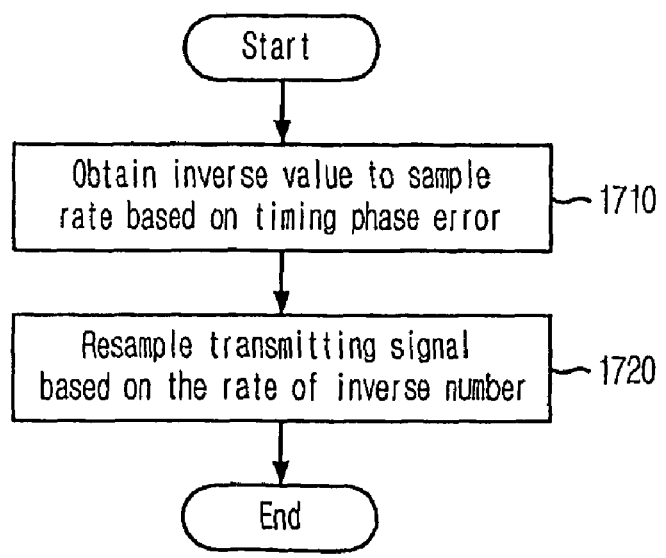
FIG. 17 is a flowchart describing a timing error reflecting method of FIG. 13 in accordance with another embodiment of the present invention.

FIG. 17, which is a flowchart describing a timing error reflecting method of FIG. 13 in accordance with another embodiment of the present invention, reflects the timing error to the transmitting signal by using the sample rate outputted from the numerically controlled oscillator 634 in the timing error compensating process.

As illustrated in FIG. 17, first, at step 1710, an inverse number of the sample rate outputted from the numerically controlled oscillator 634 is obtained and, at step 1720, the transmitting signal is resampled at a rate of the inverse number.

As described, the method of the present invention can be embodied in the form of a program and recorded in a computer-readable recording medium, such as a CD-ROM, RAM, ROM, a floppy disk, a hard disk, a magneto-optical disk. Since the process can be easily implemented by those skilled in the art easily, further description on it will not be provided.

While the present invention has been described with respect to certain preferred embodiments, it will be apparent to those skilled in the art that various changes and modifications may be made without departing from the scope of the invention as defined in the following claims.

What is claimed is:

1. A frequency synchronizing apparatus for an on-channel repeater receiving signals on one channel and distributing the signals on the same channel, comprising:
a carrier recovery means for compensating a carrier frequency error of a receiving signal;
a timing recovery means for compensating a sampling timing error of the receiving signal;
a carrier error reflecting means for reflecting the carrier frequency error extracted from the carrier recovery means to a transmitting signal;
a timing error reflecting means for reflecting the sampling timing error extracted from the timing recovery means to the transmitting signal; and
wherein the timing error reflecting means includes:
a numerically controlled oscillator for converting the sampling timing phase error extracted from the timing recovery means into a sample rate;
an inverse converter for obtaining an inverse value of the converted sample rate; and
a resampler for resampling the transmitting signal according to the inverse value of the sample rate.

2. The apparatus as recited In claim 1, wherein the carrier error reflecting means includes:
a numerically controlled oscillator for converting a carrier phase error extracted from the carrier recovery means into a frequency value;
a frequency inverter for inverting the sign of the converted frequency value; and
a frequency converter for shifting the carrier frequency of the transmitting signal as much as the sign-inverted frequency value.

3. The apparatus as recited in claim 2, wherein the carrier error reflecting means further includes:
a low pass filter for reducing phase jitter of the carrier phase error extracted from the carrier recovery means.

4. The apparatus as recited in claim 1, further including:
a low pass filter for reducing phase jitter of the sampling timing phase error extracted from the timing recovery means.

5. The apparatus as recited in claim 1, further comprising:
an inverse converter for obtaining an inverse value of the sample rate based on the sampling timing phase error outputted from the numerically controlled oscillator of the timing recovery means; and
a resampler for resampling the transmitting signal according to the inverse value of the sample rate.

6. A frequency synchronizing apparatus for an on-channel repeater receiving signals on one channel and distributing the signals on the same channel, comprising:
a carrier recovery means for compensating a carrier frequency error of a receiving signal;
a timing recovery means for compensating a sampling timing error of the receiving signal;
a carrier error reflecting means for reflecting the carrier frequency error extracted from the carrier recovery means to a transmitting signal;
a timing error reflecting means for reflecting the sampling timing error extracted from the timing recovery means to the transmitting signal; and
wherein the carrier error reflecting means includes:
a frequency inverter for inverting the sign of the carrier frequency error outputted from a numerically controlled oscillator of the carrier recovery means; and
a frequency converter for shifting the carrier frequency of the transmitting signal as much as the sign-inverted carrier frequency error.

7. A frequency synchronizing apparatus for an on-channel repeater receiving signals on one channel and distributing the signals on the same channel, comprising:
an analog-digital converting means for converting an analog receiving signal into a digital signal;
a carrier recovery means for compensating a carrier frequency error of the digital signal;
a timing recovery means for compensating a sampling timing error of the digital signal;
a carrier error reflecting means for reflecting the carrier frequency error extracted from the carrier recovery means to a transmitting signal;
a digital-analog converting means for converting the transmitting signal reflected with the carrier frequency error into an analog signal; and
a voltage controlled oscillator for reflecting the sampling timing error extracted from the timing recovery means to an oscillation signal and providing the oscillation signal to the analog-digital converting means and the digital-analog converting means.

8. The apparatus as recited in claim 7, wherein the carrier error reflecting means includes:
a numerically controlled oscillator for converting the carrier phase error extracted from the carrier recovery means into a frequency value;
a frequency inverter for inverting the sign of the converted frequency value; and
a frequency converter for shifting a carrier frequency of the transmitting signal as much as the sign-inverted frequency value.

9. The apparatus as recited in claim 8, wherein the carrier error reflecting means further includes:
a low pass filter for reducing phase jitter of the carrier phase error extracted from the carrier recovery means.

10. The apparatus as recited in claim 7, wherein the carrier error reflecting means includes:
a frequency inverter for inverting the sign of the carrier frequency error outputted from the numerically controlled oscillator of the carrier recovery means; and
a frequency converter for shifting a carrier frequency of the transmitting signal as much as the sign-inverted carrier frequency error.

11. A frequency synchronizing method for an on-channel repeater receiving signals on one channel and distributing the signals on the same channel, comprising the steps of:
a) compensating a carrier frequency error of a receiving signal;
b) compensating a sampling timing error of the receiving signal;
c) reflecting the carrier frequency error extracted in the step (a) to a transmitting signal;
d) reflecting the sampling timing error extracted in the step (b) to the transmitting signal; and
wherein the step d) includes the step of:
d1) converting the sampling timing phase error detected in the step b) into a sample rate;
d2) obtaining an inverse value of the sample rate; and
d3) resampling the transmitting signal according to the inverse value of the sample rate.

12. The method as recited in claim 11, wherein the step c) includes the steps of:
c1) converting a carrier phase error extracted in the step a) into a frequency value;
c2) inverting the sign of a converted frequency value; and
c3) shifting the carrier frequency of the transmitting signal as much as the sign-inverted frequency value.

13. The method as recited in claim 12, wherein the step c) further includes the step of:
   c4) reducing phase jitter of the carrier phase error extracted from the step a).

14. The method as recited in claim 11, wherein the step d) further includes the step of:
   d4) reducing phase jitter of the sampling timing phase error detected in the step b).

15. The method as recited in claim 11, wherein the step b) includes the step of:
   b1) detecting a sampling timing phase error in the receiving signal and converting the sampling timing phase error into a sample rate, and
   the step d) includes the steps of:
   d2) obtaining an inverse value of the sample rate; and
   d3) resampling the transmitting signal according to the inverse value of the sample rate.

16. A frequency synchronizing method for an on-channel repeater receiving signals on one channel and distributing the signals on the same channel, comprising the steps of:
   a) compensating a carrier frequency error of a receiving signal;
   b) compensating a sampling timing error of the receiving signal;
   c) reflecting the carrier frequency error extracted in the step (a) to a transmitting signal; and
   d) reflecting the sampling timing error extracted in the step (b) to the transmitting signal; and
   wherein the step a) includes the step of:
      a1) detecting a carrier phase error in the receiving signal and converting the carrier phase error into a frequency value, and
   the step c) includes the steps of:
      c2) inverting the sign of the frequency value; and
      c3) shifting a carrier frequency of the transmitting signal as much as the sign-inverted frequency value.

17. A frequency synchronizing method for an on-channel repeater receiving signals on one channel and distributing the signals on the same channel, comprising the steps of:
   a) converting an analog receiving signal into a digital signal;
   b) compensating a carrier frequency error of the digital signal;
   c) compensating a sampling timing error of the digital signal;
   d) reflecting the carrier frequency error extracted in the step b) to a transmitting signal; and
   e) converting the transmitting signal reflected with the carrier frequency error into an analog signal,
   wherein the sampling timing error detected in the step c) is equally used in the steps a) and e).

18. The method as recited in claim 17, wherein the step d) includes the steps of:
   d1) converting the carrier phase error extracted in the step b) into a frequency value;
   d2) inverting the sign of the converted frequency value; and
   d3) shifting a carrier frequency of the transmitting signal as much as the sign-inverted frequency value.

19. The method as recited in claim 17, wherein the step d) further includes the step of:
   d4) reducing phase jitter of the extracted carrier phase error.

20. The method as recited in claim 17, wherein the step b) includes the step of:
   b1) detecting a carrier phase error in the receiving signal and converting the detected carrier phase error into a frequency value, and
   the step d) includes the steps of:
   d2) inverting the sign of the frequency value; and
   d3) shifting a carrier frequency of the transmitting signal as much as the sign-inverted frequency value.

* * * * *